US006521974B1

(12) United States Patent
Oda et al.

(10) Patent No.: US 6,521,974 B1
(45) Date of Patent: Feb. 18, 2003

(54) BIPOLAR TRANSISTOR AND MANUFACTURING METHOD THEREOF

(75) Inventors: Katsuya Oda, Hachioji (JP); Eiji Ohue, Ome (JP); Masao Kondo, Higashimurayama (JP); Katsuyoshi Washio, Tokorozawa (JP); Masamichi Tanabe, Tokyo (JP); Hiromi Shimamoto, Iruma (JP)

(73) Assignees: Hitachi, Ltd., Tokyo (JP); Hitachi Device Engineering Co., Ltd., Mobara (JP)

( * ) Notice: Subject to any disclaimer, the term of this patent is extended or adjusted under 35 U.S.C. 154(b) by 0 days.

(21) Appl. No.: 09/689,800

(22) Filed: Oct. 13, 2000

(30) Foreign Application Priority Data

Oct. 14, 1999 (JP) .............................. 11-291808
Mar. 22, 2000 (JP) ....................... 2000-084708

(51) Int. Cl.⁷ ............................... H01L 29/70
(52) U.S. Cl. ....................... 257/593; 257/592; 257/616; 257/197; 257/565
(58) Field of Search ................... 257/197, 613, 257/616, 565, 592, 593; 438/235, 309, 312, 317, 752, 933

(56) References Cited

U.S. PATENT DOCUMENTS 5,504,018 A * 4/1996 Sato et al. ..................... 437/31
5,508,553 A * 4/1996 Nakamura et al. ........... 257/576
5,698,890 A * 12/1997 Sato ............................. 257/592
5,834,800 A * 11/1998 Jalali-Farahani et al. ... 257/198
5,962,880 A * 10/1999 Oda et al. .................... 257/198
6,414,372 B2 * 7/2002 Kinoshita .................... 257/593

FOREIGN PATENT DOCUMENTS

JP        7106341         4/1995

* cited by examiner

Primary Examiner—Nathan J. Flynn
Assistant Examiner—Johannes P Mondt
(74) Attorney, Agent, or Firm—Antonelli, Terry, Stout & Kraus, LLP

(57) ABSTRACT

A bipolar transistor according to the invention is provided with structure that an intrinsic base made of single crystal Si—Ge and a base leading-out electrode are connected via a link base made of polycrystal Si—Ge by doping at high concentration, further, a part immediately under the intrinsic base has the same conductive type as that of a collector and in a peripheral part, a single crystal Si—Ge layer having the same conductive type as that of a base is provided between the intrinsic base and a collector layer. Hereby, the reduction of the resistance of the link base between the intrinsic base and the base leading-out electrode and the reduction of capacitance between the collector and the base are simultaneously realized, and a self-aligned bipolar transistor wherein capacitance between an emitter and the base and capacitance between the collector and the base are respectively small, power consumption is small and high speed operation is enabled is acquired.

21 Claims, 12 Drawing Sheets

BIPOLAR TRANSISTOR AND MANUFACTURING METHOD THEREOF

BACKGROUND OF THE INVENTION

The present invention relates to a bipolar transistor and its manufacturing method, and particularly relates to a bipolar transistor using single crystal silicon germanium as an intrinsic base layer and its manufacturing method.

A bipolar transistor using conventional type single crystal silicon germanium as an intrinsic base layer is disclosed in Japanese published unexamined patent application No. Hei 7-106341, for example. FIG. 15 shows the sectional structure of the conventional type bipolar transistor.

As shown in FIG. 15, a reference number 101 denotes a silicon substrate, and, after a high concentration n-type buried layer 102 is formed in a part of the silicon substrate 101 and a low concentration n-type silicon layer 103 which will be a collector layer is epitaxially grown on the overall surface of the silicon substrate 101, a device isolation layer 104 is selectively formed. A high concentration n-type area 105 is formed in a part which will be a collector by implanting n-type dopant ions. After three layers of a collector-base isolation layer 106, extrinsic base polysilicon 107 and an emitter-base isolation layer 109 are deposited, an emitter opening is formed, and a second emitter isolation layer 110 is formed on the respective side walls of the emitter-base isolation layer 109 and the extrinsic base polysilicon 107.

Next, an overhang of the extrinsic base polysilicon 107 is formed by selectively etching the collector-base isolation layer 106. Then, at the same time that a low concentration p-type single crystal silicon layer 111 is formed on the surface of the low concentration n-type silicon layer 103, a low concentration p-type polysilicon layer 112 is selectively formed on the bottom of the overhang of the extrinsic base electrode. In this case, p-type dopant is diffused into the polysilicon 112 from the extrinsic base polysilicon 107 by applying heat treatment at 900° C. for five minutes, for example, to be a high concentration p-type. An intrinsic base 113 composed of a p-type single crystal silicon germanium layer is formed on the low concentration p-type single crystal silicon layer 111 by selective growth, again and a link base 114 composed of a p-type polycrystalline silicon germanium layer is simultaneously formed on the high concentration p-type polysilicon layer by selective growth again. Hereby, the intrinsic base 113 and the extrinsic base electrode 107 are connected via the link bases 112 and 114 in a self-aligned manner.

Next, an n-type single crystal silicon layer 116 is formed by implanting n-type dopant ions only into the opening using the emitter-base isolation layer 110 as a mask so that an intrinsic area of the transistor is included. After a third emitter-base isolation layer 115 is formed on the side wall of the opening, an n-type single crystal silicon layer 117 which will be an emitter is epitaxially grown, and a base electrode 118, an emitter electrode 119, and a collector electrode 120 are formed.

In the bipolar transistor using the conventional type single crystal silicon germanium for the intrinsic base layer, to enhance the concentration of the polysilicon layer 112 formed under the overhang of the extrinsic base electrode, it is necessary to apply annealing and diffuse dopant from the extrinsic base polysilicon 107. Because of the annealing, n-type dopant included in the high concentration n-type buried layer 102 is diffused and the profile of impurities in the intrinsic part of the transistor varies.

Also, as contaminations such as oxygen and carbon adhere to the surface of the single crystal silicon layer 111 for annealing during epitaxial growth, a stacking fault occurs in restarted epitaxial growth.

Further, there is a problem that as the surface morphology of the single crystal silicon layer 111 is deteriorated by an oxidation-reduction reaction during annealing, a recombination center is formed on a boundary between the intrinsic base 113 and the collector layer 111, leakage current is caused in the collector-base junction of the transistor, and the breakdown voltage is deteriorated.

Also, time for heating and cooling time between the temperature of epitaxial growth and that of annealing is required in addition to time for annealing, and the throughput of wafer processing is deteriorated.

Further, there is a problem that as an energy barrier is formed on an interface between the single crystal silicon layer 111 which will be a collector layer and the intrinsic base 113 in case the single crystal silicon germanium layer is epitaxially grown as the intrinsic base 113, electrons injected from an emitter are inhibited by the energy barrier, base transit time is increased, and the operation of the transistor is slowed.

SUMMARY OF THE INVENTION

Therefore, the object of the invention is to provide a bipolar transistor wherein a single crystal silicon germanium layer is used for an intrinsic base layer, and little divergence of impurities from a high concentration buried layer occurs. It is also an object to provide a bipolar transistor in which breakdown voltage is high because few crystal defects occur in a base layer and little leakage current due to morphology is caused, external base resistance for enabling high-speed circuit operation is low, no energy barrier is caused between a collector and a base and in addition, it can be manufactured with a large throughput and its manufacturing method.

A bipolar transistor according to the invention is characterized in that it is provided with at least a first conductivity type of silicon layer, for example, as shown in FIG. 1, a low concentration n-type collector layer 3 to be a first collector area, a multilayer film composed of a first insulating film, provided on the surface of the first conductivity type of silicon layer, that is, a collector-base isolation layer 7, a second conductivity type of polycrystal layer of a reverse conductivity type to the first conductivity type, that is, a base leading-out electrode 9 made of p-type polysilicon and a second insulating film, that is, an emitter-base isolation layer 10, and an opening provided to the multilayer film. The bipolar transistor also includes a first single crystal silicon germanium layer of the second conductivity type provided in the opening, that is, a single crystal layer 13 made of single crystal silicon germanium, a second single crystal silicon germanium layer of the second conductivity type provided on the first single crystal silicon germanium layer of the second conductivity type, that is, a p-type intrinsic base layer 14 made of single crystal silicon germanium, a second conductivity type of polycrystalline silicon germanium layer provided so that the layer is in contact with both the second single crystal silicon germanium layer of the second conductivity type and the second conductivity type of polycrystal layer, that is, a p-type link base layer 15 made of polycrystalline silicon germanium. The bipolar transistor also includes a first single crystal area of the first conductivity type provided on the second single crystal silicon germanium layer of the second conductivity type, that is, a high concentration emitter area 20 composed of a single crystal layer and a second single crystal area of the first conductivity type formed including a part of the first single crystal silicon germanium layer of the second conductive type, that is, a selectively ion implanted collector area 18 which is the second single crystal area of the first conductivity type higher in concentration than the first single crystal silicon germanium layer of the second conductivity type and lower in the concentration than the first single crystal area of the first conductivity type.

In the bipolar transistor, the first single crystal area of the first conductivity type may be composed of a single crystal silicon layer or a single crystal silicon germanium layer.

Also, in the bipolar transistor, the second conductivity type of polycrystal layer may be composed of a polysilicon layer or a polycrystalline silicon germanium layer.

It is preferable that a second conductivity type of single crystal layer is provided on the second silicon germanium layer of the second conductivity type and which is lower in its concentration of impurities than the second silicon germanium layer of the second conductivity type. That is, as shown in FIG. 8, it is favorable that a low concentration cap layer 25 made of a single crystal is provided in structure where the intrinsic base area 14 and the base leading-out electrode 9 are bonded by the link base 15.

In this case, the second conductivity type of single crystal layer, that is, the cap layer 25, may be composed of a single crystal silicon layer or a single crystal silicon germanium layer.

It is preferable that in any bipolar transistor described above, in the first insulating film, shown in FIG. 1, in the first collector-base isolation layer 7 is composed of a silicon oxide film.

Also, it is preferable that in any bipolar transistor described above, in the second insulating film, shown in FIG. 1, the emitter-base isolation layer 10 is composed of a silicon oxide film.

It is preferred that in any bipolar transistor described above, a third insulating film, that is, a second collector-base isolation layer 8, is provided between the first insulating film and the second conductivity type of polycrystal layer, that is, between the first collector-base isolation layer 7 and the base leading-out layer 9 in FIG. 1.

It is also preferred that, in any bipolar transistor described above, in the third insulating film, shown in FIG. 1, the second collector-base isolation layer 8 is composed of a silicon nitride film.

Also, it is preferable that, in the bipolar transistor described above, the upper surface of the second single crystal silicon germanium layer of the second conductivity type is above the lower surface of the end of the second conductivity type of the polycrystal layer on the side close to the second single crystal silicon germanium layer of the second conductivity type, so that the upper surface of the second conductivity type of polycrystalline silicon germanium layer and the upper surface of the first single crystal area of the first conductivity type are substantially at an equal level, as shown in FIG. 11. Also, the upper surface of the intrinsic base 14 is above the lower surface of an overhang of the base leading-out electrode 9 and the upper surface of the link base 15 and the upper surface of the emitter layer 20 are substantially at an equal level.

Also, the manufacturing method of the bipolar transistor according to the invention is characterized in that the bipolar transistor is provided with a first conductivity type of silicon layer, a multilayer film composed of a first insulating film provided on the surface of the first conductivity type of silicon layer, a second conductivity type of polycrystal layer of opposite conductivity type to the first conductivity type and a second insulating film, an opening provided to the multilayer film, and a first single crystal silicon germanium layer of the second conductivity type provided in the opening. The bipolar transistor also includes a second single crystal silicon germanium layer of the second conductivity type provided on the first single crystal silicon germanium layer of the second conductivity type, a second conductivity type of polycrystalline silicon germanium layer provided so that the layer is in contact with both the second single crystal silicon germanium layer of the second conductivity type and the second conductivity type of polycrystal layer, a first single crystal area of the first conductivity type provided on the second single crystal silicon germanium layer of the second conductivity type, and a second single crystal area of the first conductivity type formed including a part of the first single crystal silicon germanium layers of the second conductivity type. A process for forming the first and second single crystal silicon germanium layer of the second conductivity type and the second conductivity type of polycrystalline silicon germanium layer is a process depending upon epitaxial growth and it is favorable that the epitaxial growth is performed under the temperature condition of 500 to 700° C. In this case, it is also preferable that pressure in growth does not exceed 100 Pa.

The objects of the invention described above and other objects will be clarified by the following detailed description and attached claims, which refer to the attached drawings. In the attached drawings, the same reference numbers denote the same or similar parts.

DESCRIPTION OF THE PREFERRED EMBODIMENTS

Figure 1:
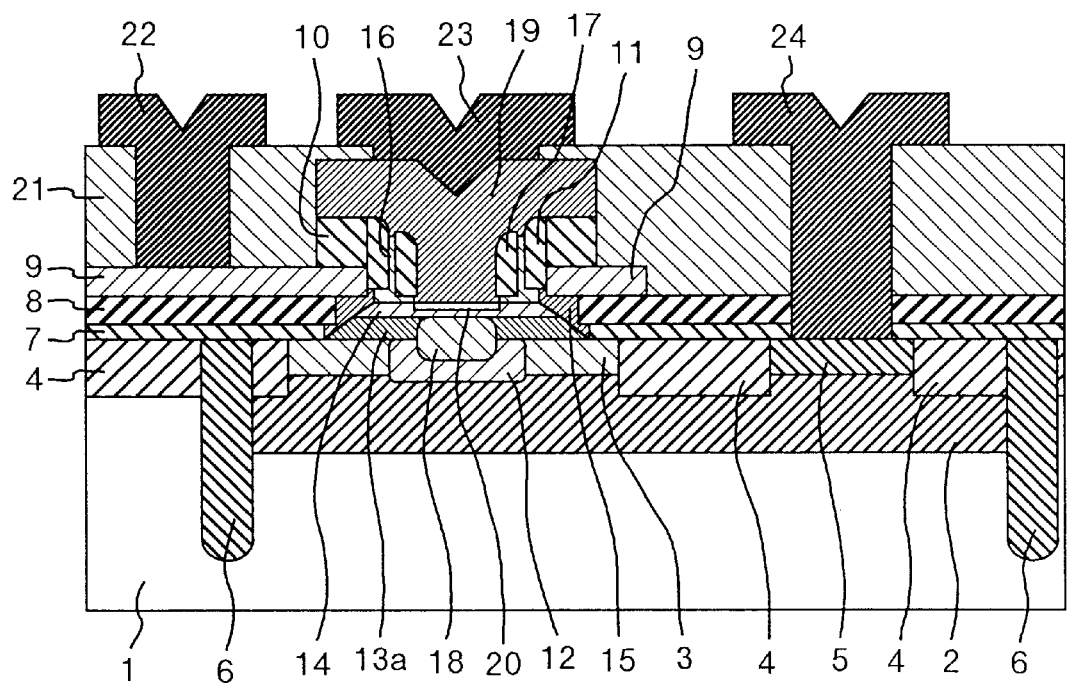
FIG. 1 is a sectional view showing a first embodiment of a bipolar transistor according to the invention.

A preferred embodiment of a bipolar transistor according to the invention is characterized in that an opening is formed in a multilayer film composed of a base leading-out electrode composed of a collector-base isolation layer formed in a first collector area on a silicon substrate, and a polysilicon and an emitter-base isolation layer. A second collector area is formed on the first collector area via the opening, a low concentration single crystal silicon germanium layer of an opposite conductivity type to the conductivity type of the first collector area is further provided only in the opening, and in addition, the base leading-out electrode and an intrinsic base area made of single crystal silicon germanium provided on the low concentration single crystal silicon germanium layer are in contact via a link base made of polycrystalline silicon germanium. A third collector area including a part of the low concentration single crystal silicon germanium layer and having the same conductivity type as that of the first collector area is also provided.

As described above, as the intrinsic base and the base leading-out electrode are automatically connected via the link base, the base resistance of a connection can be reduced. In addition, the transit time of a carrier from a base to a collector can be reduced by providing the third collector area so that the area includes an intrinsic part of the low concentration single crystal silicon germanium. Still further, a profile also including germanium in the collector area is acquired.

Therefore, as no energy barrier caused by the difference in a band gap between silicon and silicon germanium in a collector-base junction is formed, the speedup of the transistor is enabled.

Also, as a depletion layer extends in the first collector area and the low concentration single crystal silicon germanium layer is also depleted when voltage in a reverse direction is applied between the collector and the base because a peripheral part of the low concentration single crystal silicon germanium layer has an opposite conductivity type to the conductivity type of the first collector area, capacitance between the collector and the base can be reduced. In addition, as an emitter, the base and the collector are formed in a self-aligned manner, and the capacitance between the emitter and the base and capacitance between the collector and the base can be reduced. Therefore, the bipolar transistor according to the invention enables high speed operation.

Also, a preferred embodiment of the manufacturing method of the bipolar transistor according to the invention is characterized in that the temperature when the single crystal silicon germanium of the intrinsic base layer, the low concentration collector layer, and a low concentration cap layer respectively composing the bipolar transistor are formed by epitaxial growth is between 500° C. and 700° C. However, it is preferable that the bipolar transistor is manufactured under a condition that the pressure in epitaxial growth does not exceed 100 Pa.

In a case where single crystal silicon germanium is grown under such a condition of epitaxial growth, a single crystal silicon germanium layer is deposited on single crystal silicon or single crystal silicon germanium depending upon the content of germanium and the thickness of a grown film. However, polycrystalline silicon germanium can be prevented from being deposited on polysilicon, a silicon oxide film or a silicon nitride film.

Therefore, when the low concentration collector layer is formed, polycrystalline silicon germanium is not deposited on the base leading-out electrode, and the collector-base isolation oxide layer, the emitter-base isolation layer, and low concentration single crystal silicon germanium can be formed only on the second collector layer. Further, the intrinsic base and the base leading-out electrode are connected via only doped polycrystalline silicon germanium, deposited at the same time as the formation of the intrinsic base by depositing polycrystalline silicon germanium on the base leading-out electrode at the same time as the growth of the intrinsic base. Hereby, as the resistance of the base can be reduced, and in addition, annealing for reducing the resistance of a base connection is not required, no diffusion of impurities in a high concentration buried layer is caused. Hereby, the design of the impurities profile of the intrinsic part of the transistor is facilitated.

Next, a concrete embodiment of the bipolar transistor and its manufacturing method according to the invention will be described in detail below, respectively, referring to the attached drawings.

<First Embodiment>

FIG. 1 is a sectional structural drawing showing the first embodiment of the bipolar transistor according to the invention. The manufacturing method of the bipolar transistor having the structure shown in FIG. 1 will be described below. First, after n-type impurities are doped into a p-type silicon substrate 1 by ion implantation, using a photoresist mask in which an area from a base layer formation scheduled area to a collector electrode formation scheduled area is exposed and a high concentration n-type buried layer 2 is formed by thermal diffusion, a low concentration n-type single crystal silicon layer 3 which will be a first collector layer is epitaxially grown.

Afterward, a field oxide film 4 is selectively formed on the surface of the low concentration n-type single crystal silicon layer 3, except for on the base layer and the collector electrode area by local oxidation of silicon (LOCOS). Or after the low concentration single crystal silicon layer except for the base layer and the collector electrode area, is etched by approximately 400 nm by dry etching and a silicon oxide film is deposited by chemical vapor deposition (CVD), the field oxide film 4 may also be buried by chemical mechanical polishing (CMP).

Next, a high concentration n-type extrinsic collector layer 5 is formed by doping high concentration n-type impurities in only the collector electrode formation area by ion implantation and thermally diffusing them. A device isolation area 6 is formed by forming a groove approximately 3 μm deep in the field oxide film 4 and the silicon substrate 1, using a photoresist mask having a groove-shaped opening approximately 0.4 μm wide, and by dry etching around the high concentration n-type buried layer and embedding a silicon oxide film in the groove.

Next, a first collector-base isolation layer 7 composed of a silicon oxide film is formed. At this time, when an opening to be an active area described later, of the transistor is formed by etching by depositing a second collector-base isolation layer 8 composed of a silicon nitride film on the first collector-base isolation layer 7, the surface of the single crystal silicon layer 3 is never damaged. Also, there is the effect that the variation of the respective shapes of the first emitter-base isolation layer 10 and a second emitter-base isolation layer 11 can be reduced by reducing the thickness of the first collector-base isolation layer 7 in the etching which will be described later of the first collector-base isolation layer 7.

Next, a base leading-out electrode 9 made of high concentration p-type polysilicon and the first emitter-base isolation layer 10 composed of a silicon oxide film are formed. After an opening is provided in the silicon oxide film 10 and the base leading-out electrode 9 and the emitter-base isolation layer 11 composed of a silicon oxide film is formed, an opening is formed in a multilayer film composed of the first and second collector-base isolation layers 7 and 8. A second collector area 12 is formed by doping n-type impurities into the opening by ion implantation.

Next, a low concentration p-type single crystal layer 13 made of single crystal silicon germanium, a p-type intrinsic base layer 14 made of single crystal silicon germanium, and a p-type link base layer 15 made of polycrystalline silicon germanium are formed in the opening. Further, a third collector area 18 is formed by forming third and fourth emitter-base isolation layers 16 and 17 on the side wall of the opening and doping n-type impurities by ion implantation, so that an intrinsic part of the low concentration p-type single crystal layer 13 is included. An emitter area 20 is formed in the single crystal silicon germanium layer 14 by depositing an emitter electrode 19 made of high concentration n-type polysilicon and annealing it. After an insulating film 21 is deposited and flattened, a base electrode 22, an emitter electrode 23, and a collector electrode 24 are formed by forming an opening in an emitter part, a base part, and a collector part of the insulating film 21 and embedding tungsten therein.

In the bipolar transistor, polycrystalline silicon germanium may also be used for the base leading-out electrode 9. In the following embodiments, polycrystalline silicon germanium may be used similarly used for this layer.

Figure 2A:
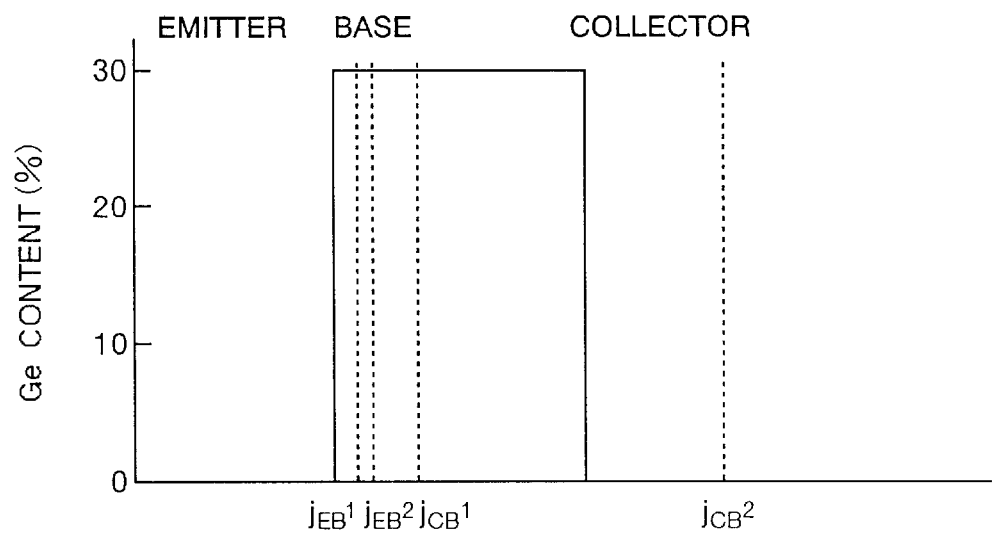
FIG. 2A shows the germanium content of the bipolar transistor shown in FIG. 1.
Figure 2B:
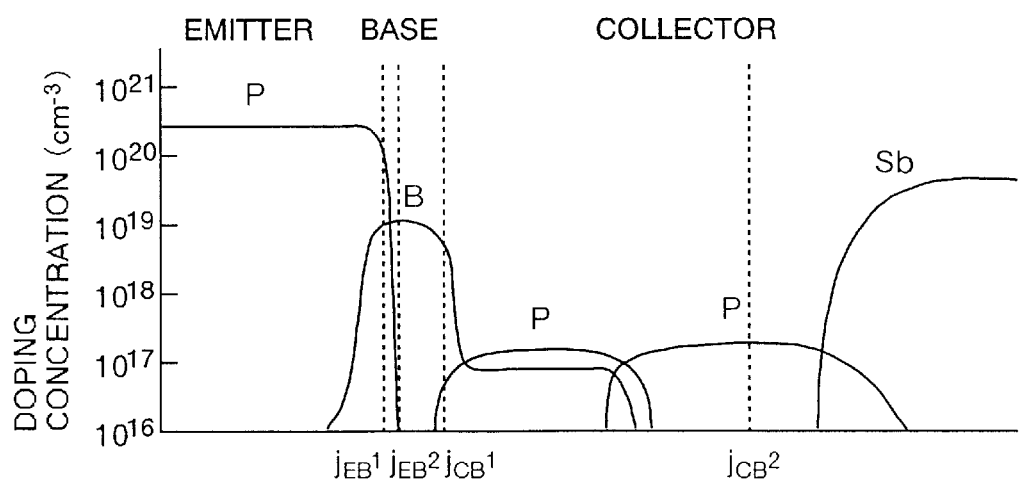
FIG. 2B shows the impurities concentration profile of the bipolar transistor shown in FIG. 1.

FIGS. 2A and 2B show the germanium content and the impurities profile of the bipolar transistor formed as described above in this embodiment, and FIG. 3 shows an energy band structure. In these drawings, $jEB^1$ and $jEB^2$ respectively show a position on the side of the emitter and on the side of the base at the end of the depletion layer in an emitter-base junction, and $jCB^1$ and $jCB^2$ respectively show a position on the side of the base and on the side of the collector at the end of the depletion layer in a collector-base junction. Also, as shown in FIG. 2B, the concentration of phosphorus (P) is shown in the emitter area, the concentration of boron (B) is shown in the base area and the concentration of phosphorus (P) is shown in the low concentration n-type collector area and the concentration of antimony (Sb) is shown in the high concentration n-type buried layer.

Figure 3:
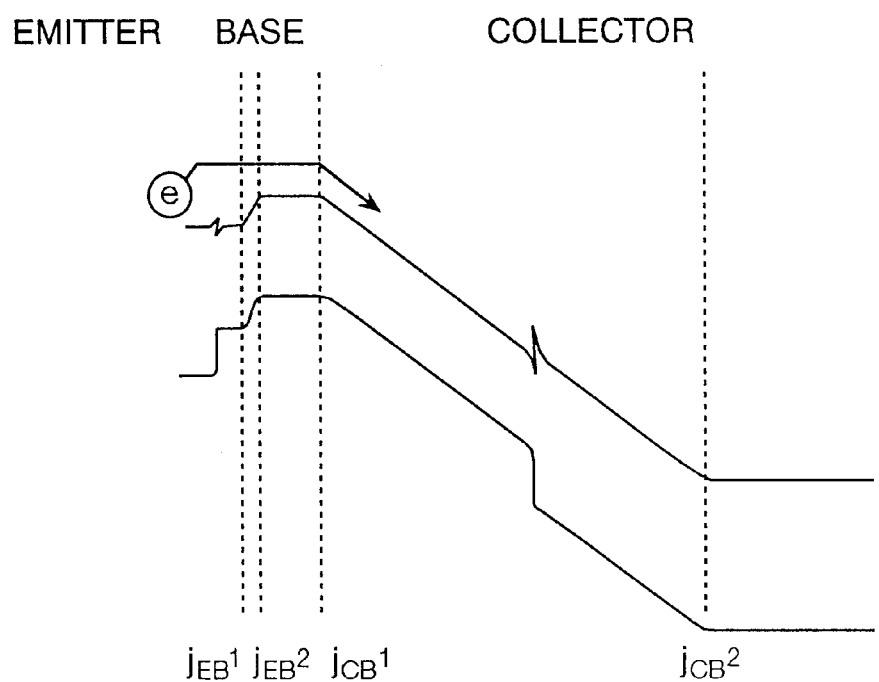
FIG. 3 schematically shows the energy band structure of the bipolar transistor having profiles shown in FIGS. 2A and 2B.

As is clear from FIG. 2A, germanium is included not only in the base layer but also in the collector area. As a result, as shown in FIG. 3, an energy barrier caused by the difference in a band gap between silicon and silicon germanium is included in a depletion layer between the collector and the base, and a carrier injected from the emitter can reach the collector without being influenced by the barrier.

FIGS. 4A to 4C and FIGS. 5A to 5C show sectional views which explains the manufacturing method of an active area which is the main part of the bipolar transistor in this embodiment in the order of processes.

A low concentration n-type collector layer 3 made of single crystal silicon is epitaxially grown on a high concentration n-type buried layer 2, and a field oxide film 4 is selectively formed.

Next, a first collector-base isolation layer 7 composed of a silicon oxide film, a second collector-base isolation layer 8 composed of a silicon nitride film, a base leading-out electrode 9 having the thickness of approximately 200 nm and made of polysilicon (or polycrystalline silicon germanium), and a first emitter-base isolation layer 10 composed of a silicon oxide film are formed.

Next, after the first emitter-base isolation layer 10 and the base leading-out electrode 9 are etched by dry etching, using a photoresist mask in which a base formation area is open and a silicon oxide film is deposited, a second emitter-base isolation layer 11 composed of a silicon oxide film is formed on only the side wall of an opening by anisotropic dry etching.

Figure 4A:
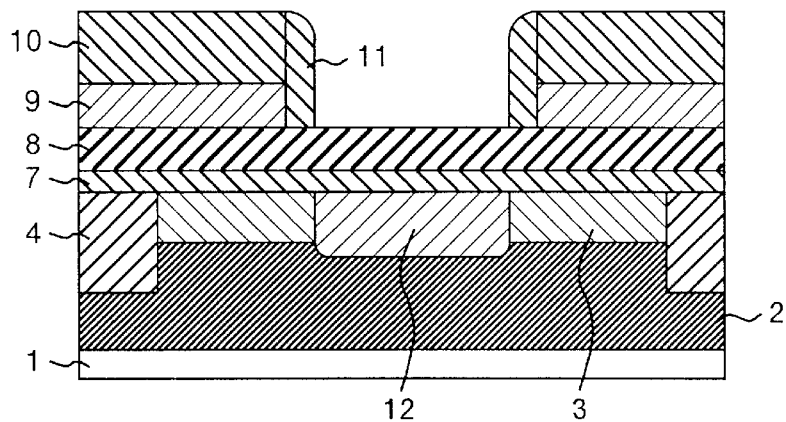
FIG. 4A is a partially enlarged sectional view showing a first steps for explaining the manufacturing method of an active area of the bipolar transistor according to the invention shown in FIG. 1 in the order of processes.

Next, a second collector area 12 is formed in only an area immediately under the opening by implanting phosphorus ions into the opening (see FIG. 4A).

Afterward, the side of the second collector-base isolation layer 8 composed of a silicon nitride film is etched by approximately 200 nm by isotropic etching, and the first collector-base isolation layer 7 composed of a silicon oxide film is isotropically etched until the surface of the low concentration n-type silicon layer 3 is exposed. For example, heated phosphoric acid can be used for the isotropic etching of a silicon nitride film and the aqueous solution of hydrofluoric acid can be used for the isotropic etching of a silicon oxide film. The low concentration n-type collector layer 3, the surface of the second collector area 12, and the bottom 9a of the base leading-out electrode are exposed by these etching. At this time, the second emitter-base isolation layer 11 composed of a silicon oxide film is also etched are thinned and the position of the lower surface 11a of the isolation layer 11 is shifted upward (see FIG. 4B).

Next, a low concentration p-type layer 13 made of single crystal silicon germanium is epitaxially grown. At this time, the low concentration p-type layer is grown under the condition that a single crystal silicon germanium layer is deposited on only the surfaces of the low concentration n-type collector layer 3 and the second collector area 12, utilizing difference between the growth start time of single crystal silicon germanium on single crystal silicon and the growth start time of polycrystalline silicon germanium on polysilicon and the isolation layer, without depositing polycrystalline silicon germanium on the bottom 9a of the base leadingout electrode, the first collector-base isolation layer 7, the second collector-base isolation layer 8, the first emitter-base isolation layer 10 or the second emitter-base isolation layer 11 (see FIG. 4C).

Figure 6:
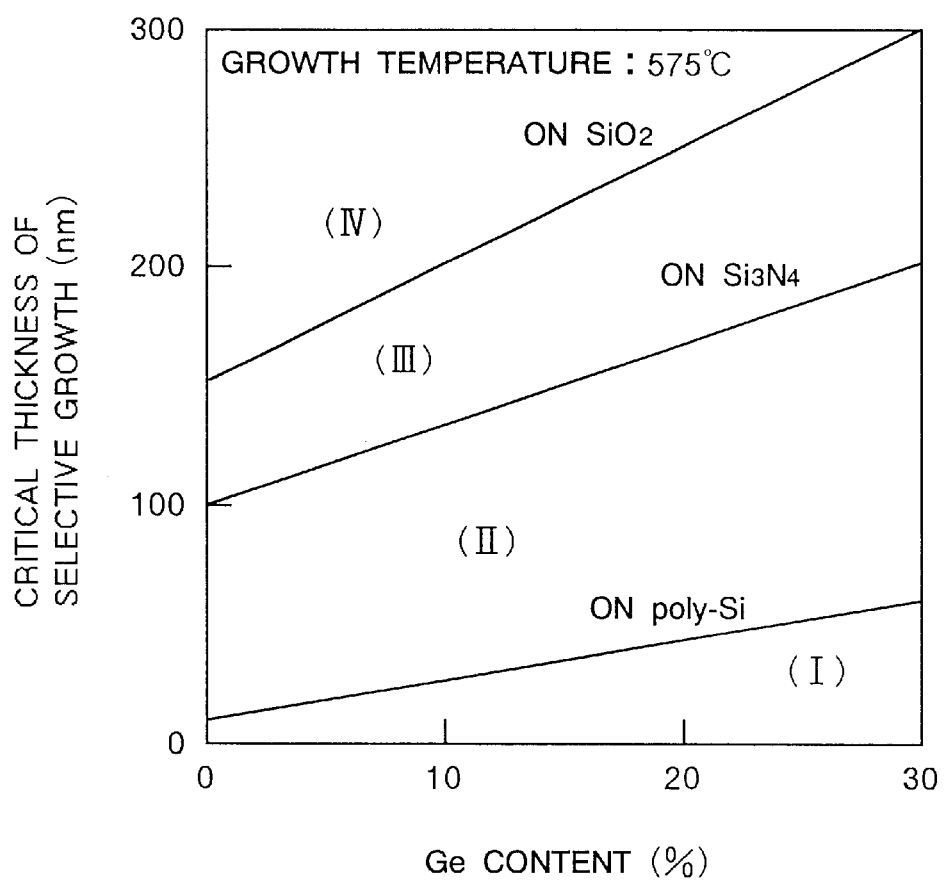
FIG. 6 is a characteristic chart showing the relationship between the maximum thickness of single crystal silicon germanium that can be selectively grown without depositing polycrystalline silicon germanium on polysilicon, a silicon oxide film or a silicon nitride film at the growth temperature of 575° C. and the germanium content.

FIG. 6 shows the relationship between the thickness in which single crystal silicon germanium is grown until polycrystalline silicon germanium begins to be deposited in case epitaxial growth temperature is 575° C. and the growth pressure is 1 Pa, for example, that is, the critical thickness of selective growth, and the content of germanium included in single crystal silicon germanium. In FIG. 6, the critical thickness in which polycrystalline silicon germanium starts to be deposited on polysilicon, a silicon oxide film, and a silicon nitride film are respectively shown.

As is clear from FIG. 6, when the thickness of single crystal silicon grown on single crystal silicon is 5 nm or less, even if only silicon is included (Ge content=0%), no single crystal silicon is deposited on polysilicon, a silicon oxide film or a silicon nitride film. Also, in the case of silicon germanium, as the content of germanium is increased, the critical thickness of selective growth increases, and even if single crystal silicon germanium approximately 50 nm thick is grown on single crystal silicon in case the content is 30%, no polycrystalline silicon germanium is deposited on polysilicon, a silicon oxide film, or a silicon nitride film. Therefore, even if the low concentration p-type layer 13 is selectively grown in an area shown by (I) in FIG. 6, no low concentration polycrystalline silicon germanium is deposited on the bottom 9a of the base leading-out electrode, the respective side walls of the collector-base isolation layers 7 and 8, or the emitter-base isolation layers 10 and hi (see FIG. 4C).

Gas source molecular beam epitaxy (MBE) and CVD can be used for such growth. However, CVD is more favorable because the control of selectivity is satisfactory. Also, the temperature ranges from 500° C., at which selectivity between a silicon oxide film or a silicon nitride film and single crystal silicon is satisfactorily acquired, to 800° C. at which a crystal defect starts to be caused. The temperature is in the range and the growth pressure has to be only 100 Pa or less at which a polycrystalline silicon germanium layer starts to be grown on a silicon oxide film or a silicon nitride film.

Figure 7:
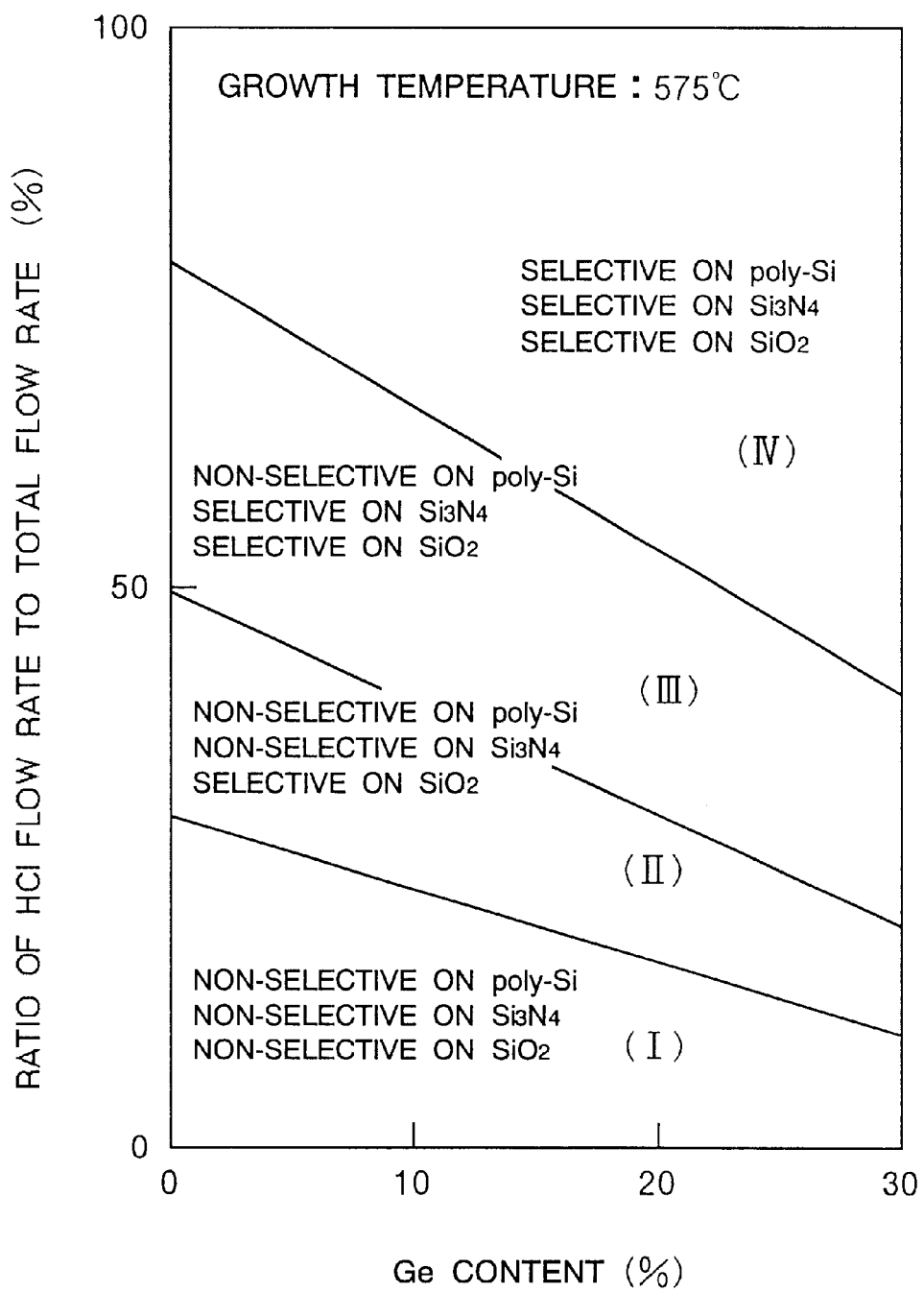
FIG. 7 is a characteristic chart showing the relationship between the ratio of HCl flow rate, in which single crystal silicon germanium can be selectively grown without depositing polycrystalline silicon germanium on polysilicon, a silicon oxide film or a silicon nitride film at the growth temperature of 575° C. to the flow rate of the total material gas and the germanium content.

The selective growth described above can also be realized by supplying chloric gas (Cl) and hydrogen chloride (HCl) during growth. FIG. 7 shows the relationship between the ratio of the flow rate of HCl required to prevent polycrystalline silicon germanium from being deposited on polysilicon, a silicon oxide film, and a silicon nitride film to the flow rate of total material gas in case the epitaxial growth temperature is 575° C. and the growth pressure is 10000 Pa, for example, and the content of germanium included in single crystal silicon germanium.

As is clear from FIG. 7, even if only silicon is included (Ge content=0%), no polysilicon is deposited on polysilicon, a silicon oxide film, or a silicon nitride film by setting the flow rate of HCl to 80% or more of the flow rate of total material gas. Also, in the case of silicon germanium, as the content of germanium is increased, the flow rate of HCl may be reduced, and no polycrystalline silicon germanium is deposited on polysilicon, a silicon oxide film, or a silicon nitride film by setting the flow rate of HCl to 40% or more of the flow rate of total material gas in case the content of germanium is 30% (an area shown by (IV) in FIG. 7).

Gas sources MBE and CVD can be used for such growth, however, CVD is more favorable because the control of selectivity is satisfactory. Also, the temperature ranges from 500° C., at which selectivity between a silicon oxide film or a silicon nitride film and single crystal silicon is satisfactorily acquired, to 800° C. at which a crystal defect starts to be caused.

Figure 5A:
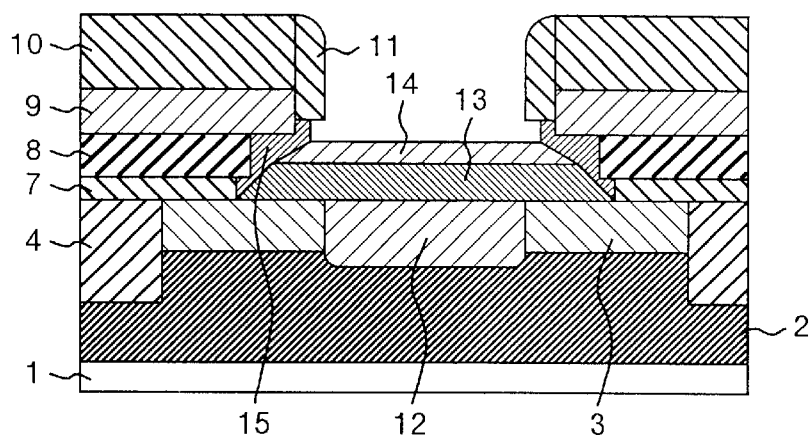
FIG. 5A is a partially enlarged sectional view showing the next steps of the process shown in FIG. 4C.
Figure 5B:
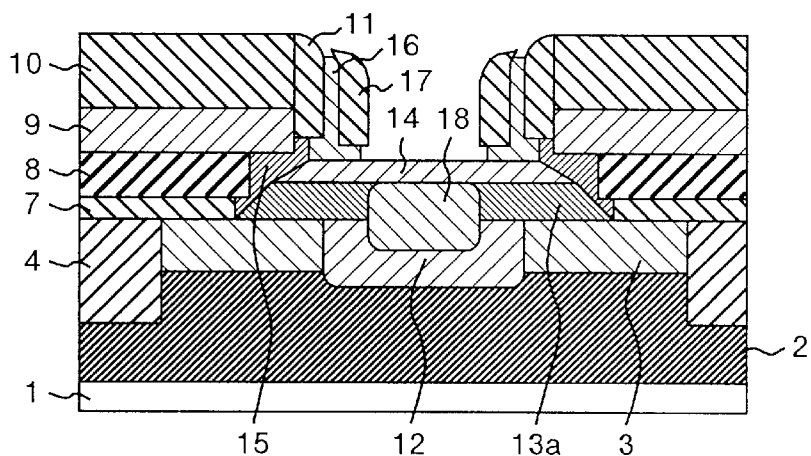
FIG. 5B is a partially enlarged sectional view showing the next steps of the process shown in FIG. 5A

When the intrinsic base layer 14 which is made of single crystal silicon germanium by doping impurities at high concentration is formed, the intrinsic base 14 and the base leading-out electrode 9 are connected via the link base 15 from the beginning of growth under a condition that polycrystalline silicon germanium is deposited on the bottom 9a of the base leading-out electrode and on the side wall of the second collector-base isolation layer 8 at the same time as the growth of single crystal silicon germanium (see FIG. 5A).

No polycrystalline silicon germanium is deposited on either of the emitter-base isolation layers 10 and 11, composed of a silicon oxide film by selectively growing single crystal silicon germanium in an area shown by (III) in FIG. 6 in the case that the epitaxial growth temperature is 575° C. and the growth pressure is 1 Pa, for example.

The selective growth described above can be also realized by supplying chloric gas (Cl) and hydrogen chloride (HCl) during growth. Polysilicon is deposited on polysilicon and a silicon nitride film by growing in an area shown by (II) in FIG. 7. However, no polysilicon is deposited on a silicon oxide film.

The performance of the bipolar transistor can be enhanced by varying the content of germanium in a single crystal silicon germanium layer. An energy band can be graded in the base layer by reducing the content of germanium in the intrinsic base layer, for example, from the side of the collector to the side of emitter. Hereby, as a carrier injected from the emitter is accelerated in the base layer by an electric field caused by the graded energy band, the higher speed operation of the transistor is enabled.

In addition, the content of germanium in the intrinsic base layer is reduced from the side of the collector to the side of emitter, however, it is not reduced up to 0% on the side of the emitter. As an energy barrier in the emitter-base junction is hereby reduced in addition to the gradation of the energy band of the base layer, the injection of carriers from the emitter into the base is also increased, and the current amplification factor can be increased.

Further, an area in which the content of germanium is increased from the side of the collector to the side of the emitter can be also provided in the low concentration n-type collector layer. As a result, since no abrupt interface between silicon and silicon germanium exists, distortion which would be caused by the difference in lattice constants of these materials is never concentrated on the interface. Therefore, as the distortion is relieved and crystal defects hardly materialize, even if heat treatment at high temperature is performed, the leakage current between the collector and the base can be reduced and breakdown voltage can be enhanced. Also, as no energy barrier is caused in a depletion layer between the collector and the base, a carrier from the base to the collector is accelerated in the depletion layer without being influenced by the energy barrier, and as the carrier reaches the collector layer, a higher speed operation of the transistor is enabled. The content of germanium on the side of the collector is set to the maximum quantity or less, at which a defect caused by distortion is not caused in the low concentration n-type collector layer and the intrinsic base layer and leakage current caused by crystal defects can be further reduced.

Also, an area in which the content of germanium in the intrinsic base layer and the low concentration n-type collector layer is increased from the side of the collector to the side of the emitter is provided, and the quantity of germanium included in the whole low concentration n-type collector layer and intrinsic base layer can be reduced by reducing the content of germanium from the side of the collector to the side of the emitter in the intrinsic base. Therefore, as crystal defects are barely caused in each interface between the collector and the base and between the emitter and the base, the reduction of leakage current and the enhancement of breakdown voltage are enabled. At this time, as a carrier injected from the emitter is accelerated in the base layer by an electric field caused by a graded energy band, the high speed operation is enabled, and as the injections of carriers from the emitter into the base are also increased, the current amplification factor increases. In addition, as no energy barrier exists in an interface between the collector and the base, the high speed operation is enabled.

After the structure shown in FIG. 5A is formed, the third and fourth emitter-base isolation layers 16 and 17 are deposited so that they cover the link base 15, and the fourth emitter-base isolation layer 17 is formed on only the side wall of the opening by anisotropic dry etching. A third collector area 18 which reaches the second collector area 12 is formed only immediately under the opening of the low concentration p-type layer 13 which is composed of a single crystal silicon germanium layer by doping n-type impurities only in the opening by ion implantation using the fourth emitter-base isolation layer 17 as a mask (see FIG. 5B).

Figure 5C:
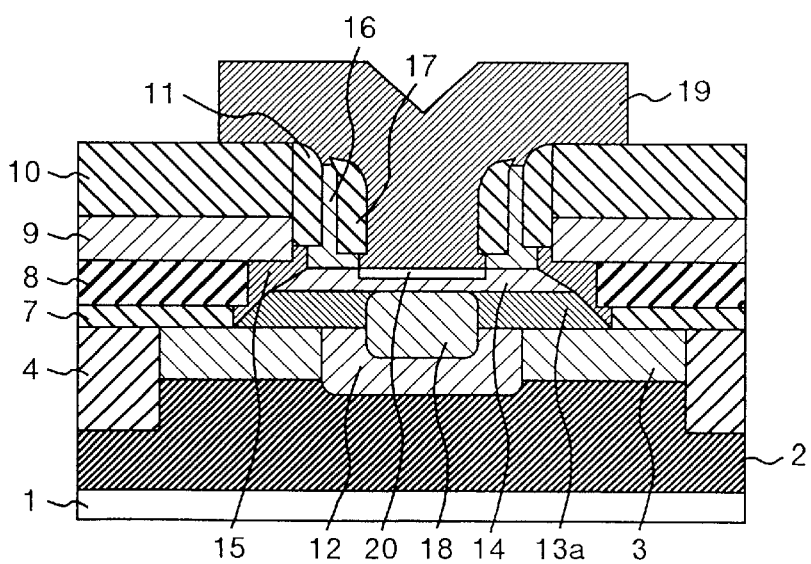
FIG. 5C is a partially enlarged sectional view showing the next steps of the process shown in FIG. 5B.

After the third emitter-base isolation layer 16 is etched and the surface of the intrinsic base 14 made of single crystal silicon germanium is exposed, high concentration n-type polysilicon 19, which will be a diffusion source of dopants into the emitter and an emitter electrode is deposited, dry etching is applied using a resist mask of a pattern that covers the emitter opening, and an emitter polysilicon electrode 19 is formed (see FIG. 5C).

Next, the n-type impurities are diffused into the single crystal silicon germanium layer 14 by annealing at 900° C. for approximately 30 seconds, an emitter area 20 is formed, and the emitter-base isolation layer 10 is etched. Afterward, dry etching is applied to the base leading-out electrode 9 using a resist mask having a pattern in a range from the periphery of a base area to a base electrode, and the base leading-out electrode 9 is formed. Next, an insulating film 21 is deposited and flattened. When an opening is formed in each area of the emitter, the base and the collector by dry etching using a photoresist mask, tungsten is embedded in the opening and a base electrode 22, an emitter electrode 23 and a collector electrode 24 are formed, the sectional structure shown in FIG. 1 is acquired.

As in this embodiment, the base width can be reduced by providing the third collector area 18 and the base transit time of a carrier can be reduced. Also, as the intrinsic base 14 and the base leading-out electrode 9 are automatically connected via the link base 15, the base resistance can be reduced. Further, as the low concentration single crystal silicon germanium layer 13a is also depleted because a peripheral part 13a of the low concentration single crystal silicon germanium layer has an opposite conductivity type to the conductivity type of the first collector area 3, capacitance between the collector and the base can be reduced. In addition, as the emitter, the base and the collector are formed in a self-aligned manner, capacitance between the emitter and the base and capacitance between the collector and the base can be reduced.

Therefore, a high speed bipolar transistor is enabled in which cut-off frequency fT and the maximum oscillation frequency fmax of which are respectively 50 GHz or more, and the speedup and the enhancement of the performance of a circuit using the transistor is also obtained.

<Second Embodiment>

Figure 8:
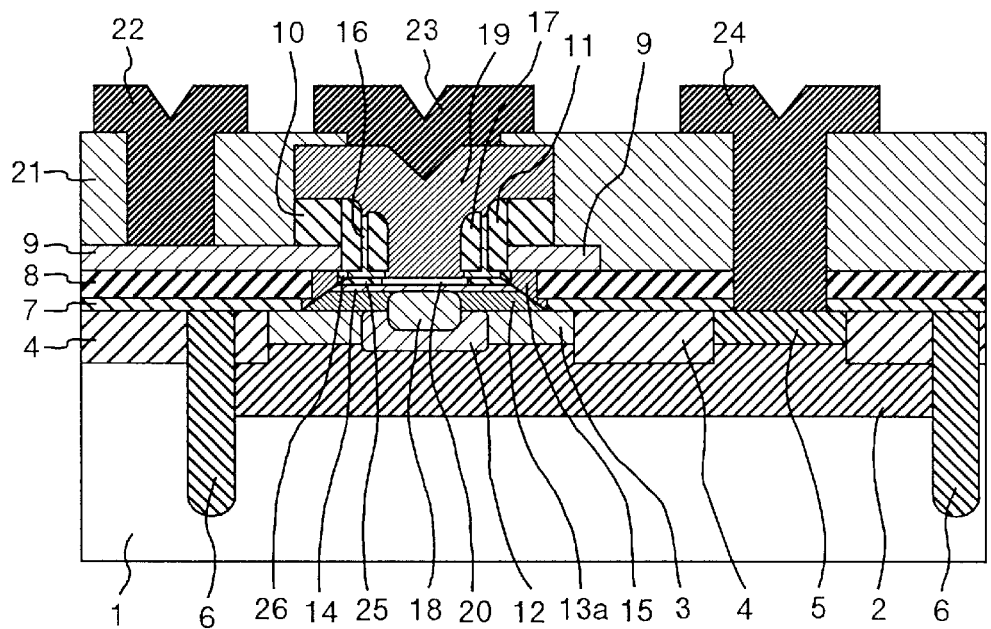
FIG. 8 is a sectional view showing a second embodiment of the bipolar transistor according to the invention.

FIG. 8 is a sectional structural drawing showing the second embodiment of the bipolar transistor according to the invention.

The same reference number is allocated to the same component as the structural part shown in FIG. 1, and the detailed description is omitted (since it is also similar in the following embodiments). That is, the bipolar transistor in this embodiment is different from the configuration shown in FIG. 1 in that a cap layer 25 made of low concentration p-type silicon is selectively grown on an intrinsic base 14 and a low concentration p-type polysilicon layer 26 is selectively grown on a link base layer 15 made of p-type polycrystalline silicon germanium.

In the bipolar transistor, single crystal silicon germanium may also be used for the low concentration cap layer 25. The same holds true in the following embodiments.

In this embodiment, as the low concentration cap layer is provided on the intrinsic base, the concentration of impurities in an emitter-base junction is lower than that in the first embodiment. As a result, tunnel current in the emitter-base junction can be reduced. Also, as a heterointerface made of silicon and silicon germanium is formed in a depletion layer in an emitter-base interface, in case single crystal silicon is used for the low concentration cap layer, an energy barrier in a valence band is larger than an energy barrier in a conduction band. As a result, the ratio of the injection efficiency of an electron from the emitter to the base to the injection efficiency of a hole from the base to the emitter increases. According to this embodiment, in addition to the effect of the first embodiment, the current amplification factor of the bipolar transistor can also be enhanced. Also, as the concentration of impurities in the emitter-base junction can be reduced, breakdown voltage between the emitter and the base can be enhanced and the characteristic of a circuit using the transistor can be enhanced.

<Third Embodiment>

Figure 9:
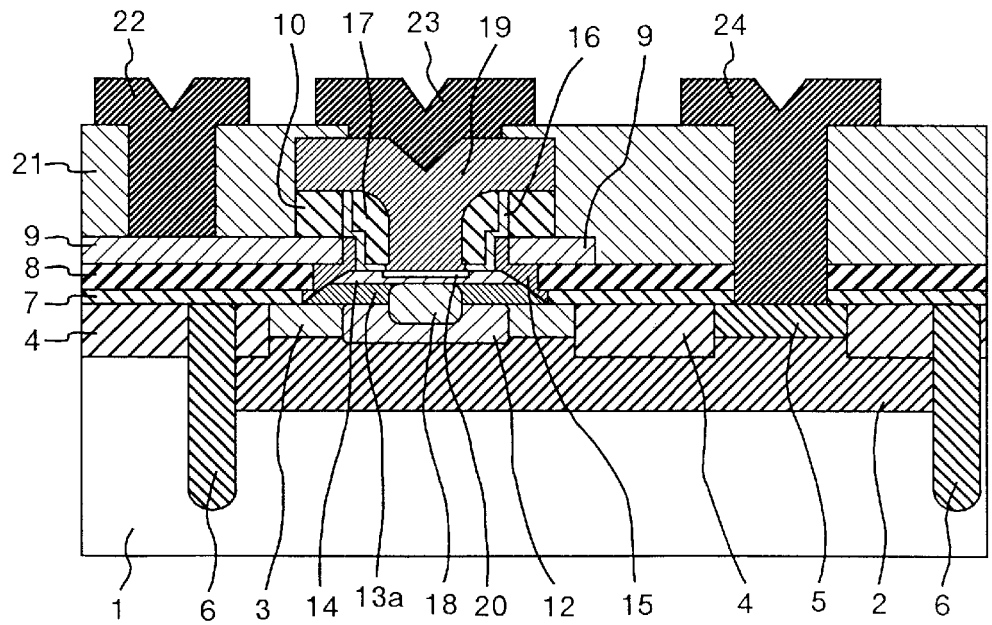
FIG. 9 is a sectional view showing a third embodiment of the bipolar transistor according to the invention.

FIG. 9 is a sectional structural drawing showing the third embodiment of the bipolar transistor according to the invention. This embodiment is different from the first embodiment, shown in FIG. 1, in that a second emitter-base isolation layer 11 is not formed on each side wall of the first emitter-base isolation layer 10 or that of the base leading-out electrode 9. That is, the structure shown in FIG. 9 is acquired by adding a process for removing the second emitter-base isolation layer 11 prior to the process for growing an intrinsic base 14 after FIG. 4C.

In this embodiment having such a structure, in addition to the effect of the first embodiment, as an area in which the intrinsic base 14 and a link base 15 are in contact is increased by forming the link base 15 on the side wall of the base leading-out electrode, the base resistance can be further reduced. As a result, the higher speed operation of the transistor is enabled and the characteristic of a circuit using the transistor can be enhanced.

<Fourth Embodiment>

Figure 10:
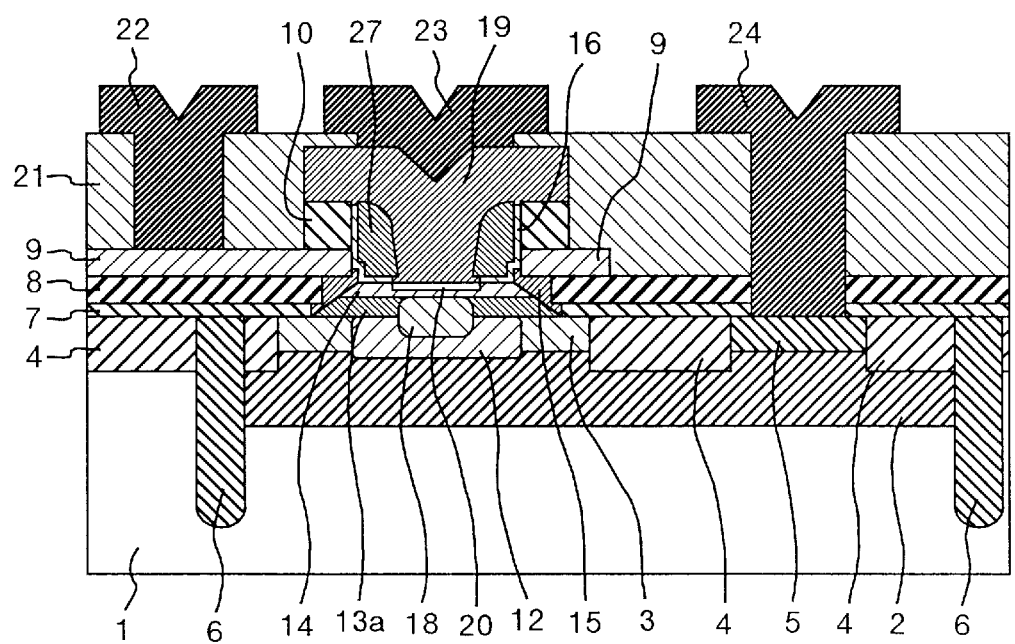
FIG. 10 is a sectional view showing a fourth embodiment of the bipolar transistor according to the invention.

FIG. 10 is a sectional, structural drawing showing the fourth embodiment of the bipolar transistor according to the invention. This embodiment is different from the first embodiment, shown in FIG. 1, in that after the intrinsic base 14 shown in FIG. 5A is formed, a second emitter-base isolation layer 11 is removed, and after a silicon oxide film 16 and conductive polysilicon 27 into which n-type impurities are doped are continuously deposited, the polysilicon 27 is formed on only the side wall of an opening by anisotropic dry etching. Next, the silicon oxide film 16 is removed by isotropic etching and the intrinsic base 14 is exposed.

The position of the upper surface of the end of a link 15 base 15 that is in contact with the lower surface 11a of the second emitter-base isolation layer hi and the position of the surface of the intrinsic base 14 remain the positions determined when the structure shown in FIG. 5A is formed, and they are not varied when the side wall composed of the silicon oxide film 16 and the polysilicon 27 is formed afterward. In this embodiment, in addition to the effect of the first embodiment, the emitter resistance can be reduced by adding the conductive polysilicon 27. Therefore, the higher speed operation of the transistor is enabled and the characteristic of a circuit using the transistor can be enhanced.

<Fifth Embodiment>

Figure 11:
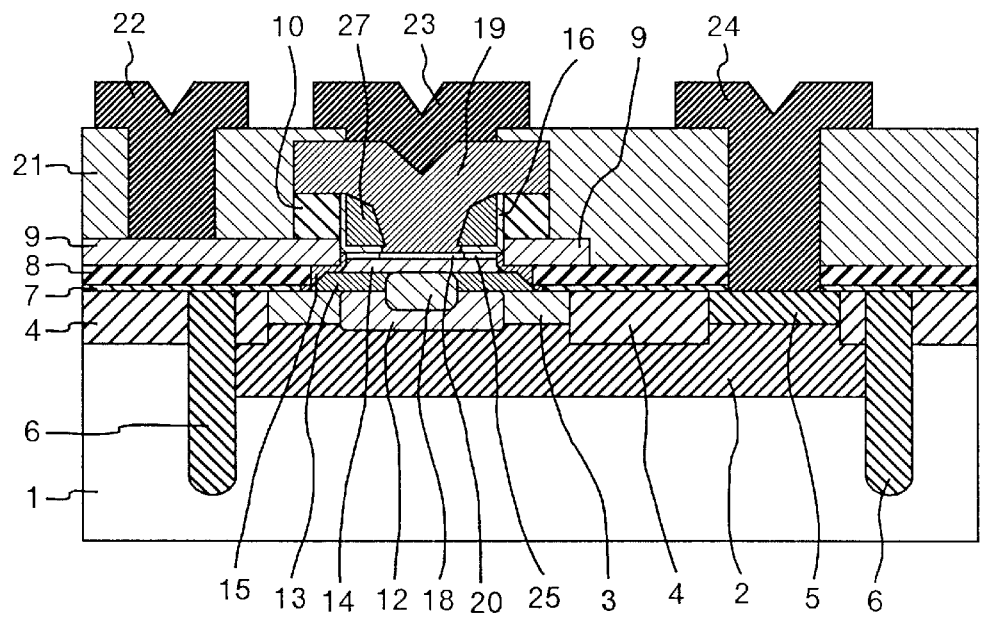
FIG. 11 is a sectional view showing a fifth embodiment of the bipolar transistor according to the invention.

FIG. 11 is a sectional view showing the fifth embodiment of the bipolar transistor according to the invention. In FIG. 11, as in the second embodiment, shown in FIG. 8, a cap layer 25 made of low concentration p-type silicon is provided on an intrinsic base 14, and after the cap layer 25 is formed, a second emitter-base isolation layer 11 is removed as in the fourth embodiment, shown in FIG. 10. After a silicon oxide film 16 and conductive polysilicon 27, into which n-type impurities are doped are continuously deposited, the polysilicon 27 is formed on only the side wall of an opening by anisotropic dry etching, and openings are made in the silicon oxide film 16 by isotropic etching.

Further, in this embodiment, the total thickness of a first collector-base isolation layer 7 composed of a silicon oxide film and a second collector-base isolation layer 8 composed of a silicon nitride film is smaller than the total thickness of a second conductivity type of single crystal silicon germanium layer 13 and a second single crystal silicon germanium layer of a second conductivity type 14.

Figure 4B:
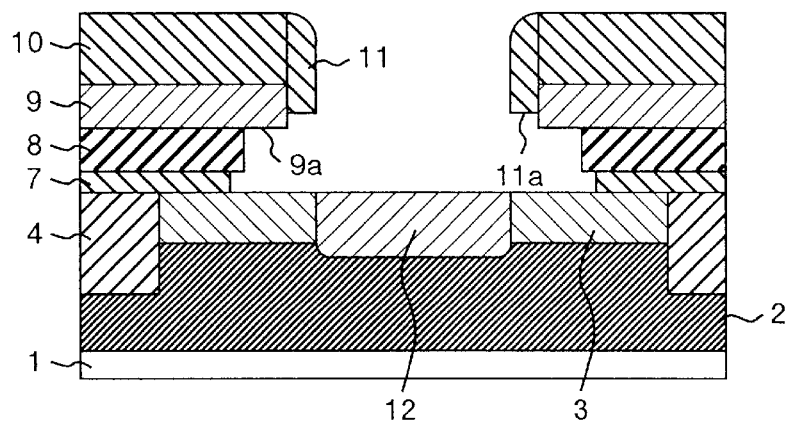
FIG. 4B is a partially enlarged sectional view showing the next steps of the process shown in FIG. 4A
Figure 4C:
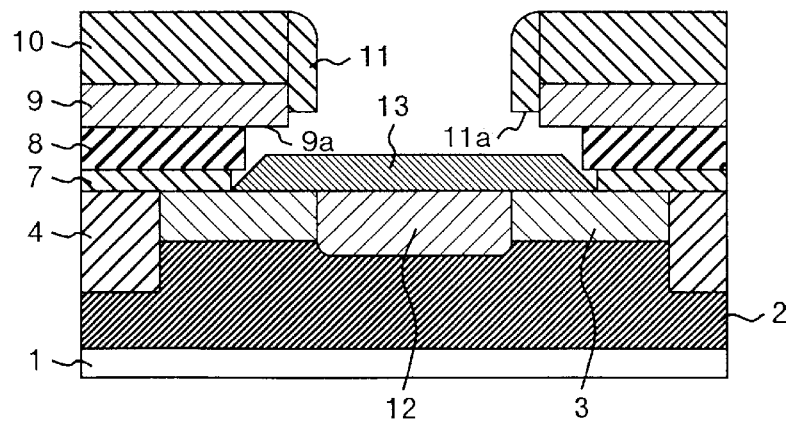
FIG. 4C is a partially enlarged sectional view showing the next steps of the process shown in FIG. 4B.

As described in the first embodiment using FIG. 4B, when an opening is formed by etching the first collector-base isolation layer 7 composed of a silicon oxide film, the side wall 11 composed of a silicon oxide film is also etched and thinned, and the position of the low surface 11a of the sidewall is shifted upward. However, as the etching processing actually has dispersion, the dispersion of processing is within 1/10 of the emitter width. In other words, the dispersion of processing of approximately ±20 nm with the position at an equal level to the upper surface of the single crystal semiconductor layer 14 in the center, in the case where a bipolar transistor having the emitter width of 0.2 μm at a minimum is supposed.

The position of the upper surface of the end of a link base 15 that is in contact with the lower surface 11a of the second emitter-base isolation layer 11 and the position of the surface of the intrinsic base 14 remain the positions determined when the base layer 14 and the cap layer 25 are formed, and they are not varied when the side wall composed of the silicon oxide film 16 and the polysilicon 27 is formed afterward.

Therefore, the structure in this embodiment is such that the upper surface of the p-type single crystal silicon cap layer 25 is located above the lower surface (the surface shown by 9a in FIG. 4) of the end of the base leading-out electrode 9 by selectively growing the single crystal layers 14 and 25 in the opening, and the upper surface (the surface that is in contact with the lower surface 11a of the side wall composed of the silicon oxide film hi shown in FIG. 4) of the link base 15 composed of a polycrystal layer and the upper surface of the single crystal silicon cap layer 25 (a part of the layer becomes an emitter area 20 in the following process) are substantially at an equal level.

In the bipolar transistor in the first embodiment, the base leading-out electrode 9 and the base area 14 are connected via the link base 15 made of polycrystalline silicon germanium in a longitudinal direction. Therefore, base current flows downward from the lower end of the base leading-out electrode 9 to the link base 15 and flows into the base area 14. Therefore, to reduce connection resistance from the base leading-out electrode to the base area, the side of the emitter of the silicon oxide film 7 is backed, and each contact area between the base leading-out electrode 9 and the link base 15 and between the link base 15 and the intrinsic base 14 is required to be increased.

However, as the contact area is increased, the junction area between the intrinsic base and the low concentration collector layer 3 is increased and base-collector capacitance is also increased. As described above, in the structure of the first embodiment or the second embodiment, the base resistance and base-collector capacitance essentially have the relationship of a trade-off. However, as the upper surface of the intrinsic base is located above the low surface of the end of the base leading-out electrode on the side close to the base area in this embodiment, a path of current that flows from the base leading-out electrode 9 to the intrinsic base 14 via the link base 15 is the path of the shortest distance, and the base resistance can be reduced without increasing the base-collector capacitance.

Also, in this embodiment, an emitter formation area is determined only by the side wall of the link base 15 formed on the side wall or the surface of the base leading-out electrode 9. As an emitter area is determined by only the side wall of the base leading-out electrode 9 by making the upper surface of the link base and the upper surface of a selectively epitaxially grown layer at a substantially equal level, the dispersion of the emitter area can be reduced, and, further, isolation between the emitter and the link base 15 can be facilitated.

<Sixth Embodiment>

Figure 12:
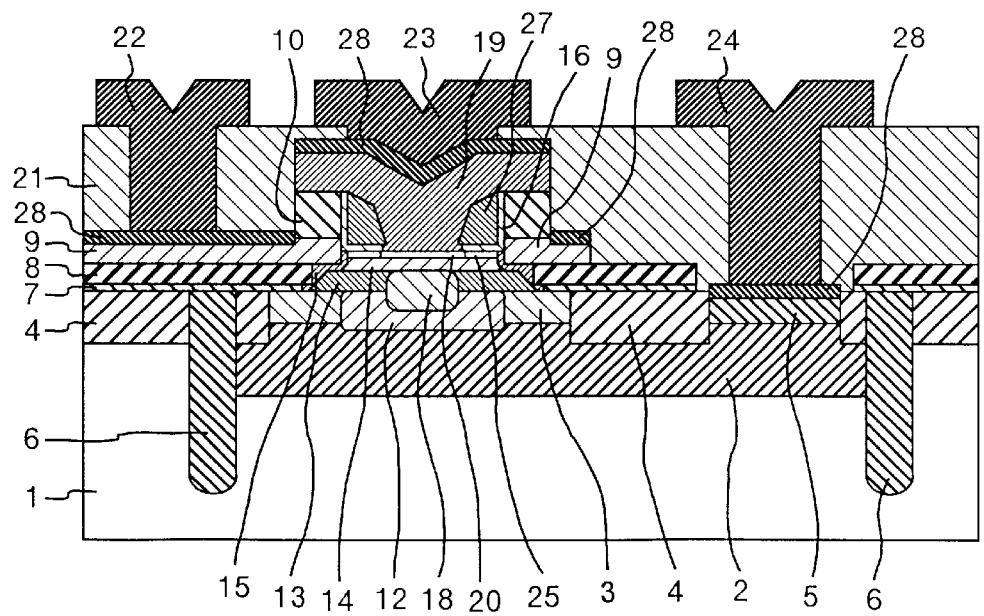
FIG. 12 is a sectional view showing a sixth embodiment of the bipolar transistor according to the invention.

FIG. 12 is a sectional view showing the sixth embodiment of the bipolar transistor and its manufacturing method respectively according to the invention. A bipolar transistor in this embodiment is different from the configuration shown in FIG. 11 in that a titanium silicide film shown by reference number 28 is provided. The manufacturing method of a semiconductor device in this embodiment will be described below.

The manufacturing method in this embodiment is the same as the manufacturing method shown in FIGS. 4A to 5C in the first embodiment. Afterward, as described in relation to FIG. 10, after a base layer is formed, a second emitter-base isolation layer 11 is removed, and, after the side wall made of polysilicon 27 is formed, openings are formed in the silicon oxide film 16. Afterward, to form the structure shown in FIG. 12, a silicon nitride film 8 and a silicon oxide film 7 are etched by dry etching using a photoresist mask in which a collector electrode formation area is open. Titanium is formed overall, heat treatment is performed, a titanium silicide film 28 is formed on an emitter polysilicon electrode 19, a base polysilicon electrode 9 and a high concentration collector leading-out layer 5, and the residual titanium is removed.

Next, a silicon oxide film 21 is deposited and flattened. The silicon oxide film 21 is etched by dry etching using a photoresist mask in which each electrode formation part made of titanium suicide 28 of an emitter, a base, and a collector is open, tungsten is embedded in an opening, and a base electrode 22, an emitter electrode 23, and a collector electrode 24 are formed. The structure shown in FIG. 12 can be acquired by the manufacturing method described above.

In the bipolar transistor in this embodiment having such a structure, contact resistance between the electrodes 23 and 22 of the emitter and the base and the polysilicon layers 19 and 9 and the contact resistance between the collector electrode 24 and single crystal silicon 5 can be greatly reduced up to ¹/₁₀, as compared with that in the fifth embodiment.

<Seventh Embodiment>

Figure 13:
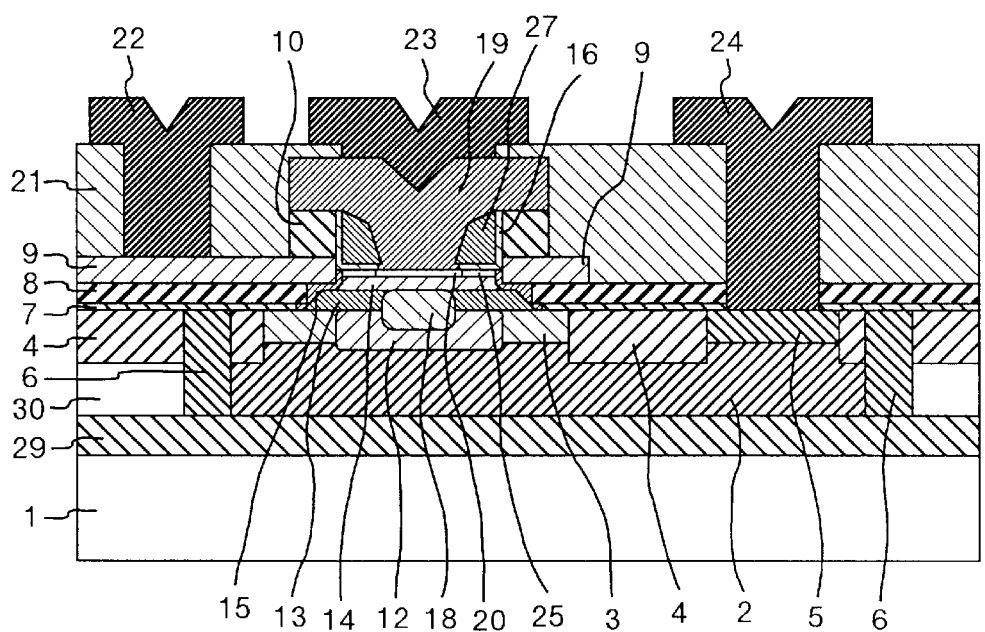
FIG. 13 is a sectional view showing a seventh embodiment of the bipolar transistor according to the invention.

FIG. 13 is a sectional view showing the seventh embodiment of the bipolar transistor according to the invention. A bipolar transistor in this embodiment uses a manufacturing method similar to that in the fifth embodiment, using a silicon on insulator (SOI) substrate provided with a silicon oxide film 29 and a single crystal silicon layer 30 on a silicon substrate 1. Collector-substrate capacitance can be reduced up to ½ owing to such a structure, as compared with that in the fifth embodiment.

<Eighth Embodiment>

Figure 14:
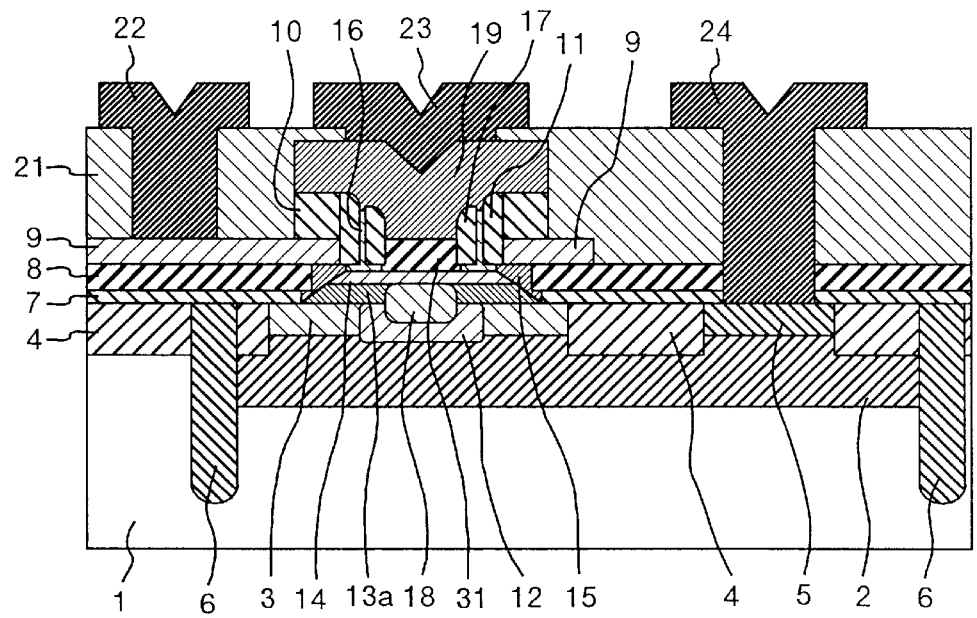
FIG. 14 is a sectional view showing an eighth embodiment of the bipolar transistor according to the invention.
Figure 15:
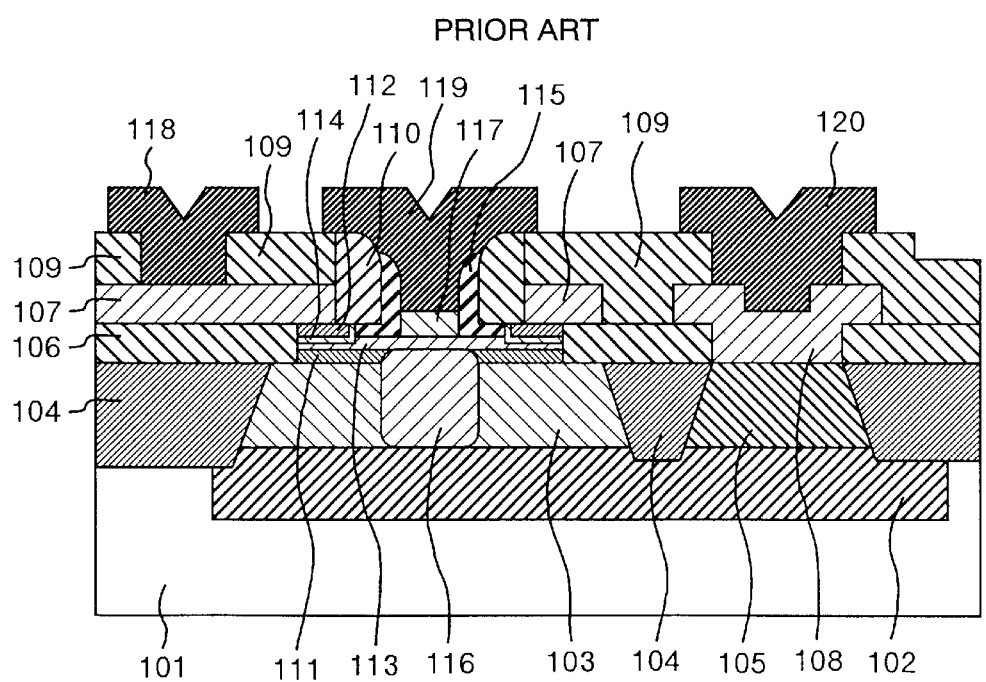
FIG. 15 is a sectional view showing a conventional type bipolar transistor using single crystal silicon germanium as an intrinsic base.

FIG. 14 is a sectional structural drawing showing the eighth embodiment of the bipolar transistor according to the invention. The manufacturing method of a bipolar transistor having the structure shown in this embodiment is as follows. An emitter opening, a second collector layer 12, a low concentration n-type collector layer 13, a p-type intrinsic base layer 14, and a p-type link base layer 15 are formed by a similar method as that in the first embodiment. After the third and fourth emitter-base isolation layers 16 and 17 are formed so that they cover the link base 15, an emitter layer 31 is formed by epitaxial growth, and a third collector layer 18 is formed by doping n-type impurities only into an opening by ion implantation afterward. The ion implantation of the n-type impurities may also be performed prior to the formation of the emitter layer 31. Next, when a high concentration n-type polysilicon 19, which will be an emitter electrode, and an insulating film 21, are deposited, an opening is formed in an emitter part, a base part and a collector part of the insulating film 21 and a base electrode 22, an emitter electrode 23 and a collector electrode 24 are formed, the sectional structure shown in FIG. 14 is acquired.

In this embodiment, as annealing at a high temperature is not required to form an emitter, the diffusion of dopants from the intrinsic base 14 and a high concentration n-type buried layer 2 can be greatly reduced. As a result, as the base transit time can be reduced as the base width is reduced, the higher speed operation of the transistor is enabled.

Also, the leakage current in a base area can be reduced by reducing the concentration of impurities in the emitter layer in an interface between the emitter and the base, and a similar effect to that in the second embodiment is acquired.

Further, as the emitter layer is formed using epitaxial growth, the concentration of impurities in the emitter layer and the controllability of the thickness are enhanced, and dispersion in the performance of transistors can be reduced.

Also, as the area of an interface between the emitter and the base can be reduced, emitter-base capacitance can be reduced and the characteristic of a circuit using the transistor can be enhanced.

As described above, according to the invention, as the intrinsic base and the base leading-out electrode are automatically connected via the link base, the base resistance can be reduced. In addition, the transit time of a carrier from the base to the collector can be reduced by equalizing the conductivity type of the intrinsic part of the low concentration single crystal silicon germanium layer with the conductivity type of the collector area. Further, as the collector area also has a profile including germanium, no energy barrier caused by a band gap between silicon and silicon germanium is formed in the vicinity of the collector-base junction, and speedup of the transistor is enabled.

Also, as the peripheral part of the low concentration single crystal silicon germanium layer has an opposite conductivity type to the conductivity type of the collector area, a depletion layer extends in the collector area when voltage in a reverse direction is applied between the collector and the base, and as a depletion layer also extends in the low concentration single crystal silicon germanium layer at the same time, capacitance between the collector and the base can be reduced. In addition, as the emitter, the base and the collector are formed in a self-aligned manner, emitter-base capacitance and collector-base capacitance can be, reduced and the high-speed operation of a circuit using the bipolar transistor is enabled.

That is, according to the bipolar transistor and the manufacturing method, respectively, of the invention, the base resistance, carrier transit time, collector-base capacitance and emitter-base capacitance can be respectively reduced and the bipolar transistor that can be operated at high speed and at a high frequency can be composed. Therefore, the performance of the whole circuit and the whole system can be enhanced by using the bipolar transistor according to the invention for the circuit and the system that particularly require high speed operation.

The preferred embodiments of the invention have been described above. However, the invention is not limited to these embodiments, and it need scarcely be said that various variations of the design are allowed in a range in which they do not deviate from the spirit of the invention.

What is claimed is:

1. A bipolar transistor comprising:
   a silicon layer of a first conductivity type;
   a multi-layer film comprised of a first insulating film, a polycrystalline layer of a second conductivity type opposite to the first conductivity type and a second insulating film deposited, respectively, on the surface of the silicon layer of the first conductivity type;
   an opening in the multi-layer film;
   a first single crystal silicon germanium layer of a second conductivity type located in the opening;
   a second single crystal silicon germanium layer of the second conductivity type provided on the first single crystal silicon germanium layer of the second conductivity type;
   a polycrystalline silicon germanium layer of the second conductivity type provided so that it is in contact with the second single crystal silicon germanium layer of the second conductivity type and the polycrystalline layer of the second conductivity type;
   a first single crystal area of a first conductivity type provided on the second single crystal silicon germanium layer of the second conductivity type; and
   a second single crystal area of the first conductivity type formed to extend into a part of the first single crystal silicon germanium layer of the second conductivity type, further comprising:
   a single crystal layer which is provided on said second single crystal silicon germanium layer of the second conductivity type and in which the concentration of the impurities is lower than that in said second single crystal silicon germanium layer of the second conductivity type.

2. A bipolar transistor according to claim 1, wherein:
   said first single crystal area of the first conductivity type is a single crystal silicon layer or a single crystal silicon germanium layer.

3. A bipolar transistor according to claim 1, wherein:
   said polycrystalline layer of the second conductivity type is a polysilicon layer or a polycrystalline silicon germanium layer.

4. A bipolar transistor according to claim 1, wherein:
said second conductive type of single crystal layer is a single crystal silicon layer or a single crystal silicon germanium layer.

5. A bipolar transistor according to claim 1, wherein:
said first insulating film is a silicon oxide film.

6. A bipolar transistor according to claim 1, wherein:
said second insulating film is a silicon oxide film.

7. A bipolar transistor according to claim 1, further comprising:
a third insulating film having an opening between said first insulating film and said polycrystalline layer of the second conductivity type.

8. A bipolar transistor according to claim 7, wherein:
said third insulating film is a silicon nitride film.

9. A bipolar transistor comprising:
a silicon layer of a first conductivity type;
a multi-layer film comprised of a first insulating film, a polycrystalline layer of a second conductivity type opposite to the first conductivity type and a second insulating film deposited respectively, on the surface of the silicon layer of the first conductivity type;
an opening in the multi-layer film;
a first single crystal silicon germanium layer of a second conductivity type located in the opening;
a second single crystal silicon germanium layer of the second conductivity type provided on the first single crystal silicon germanium layer of the second conductivity type;
a polycrystalline silicon germanium layer of the second conductivity type provided so that it is in contact with the second single crystal silicon germanium layer of the second conductivity type and the polycrystalline layer of the second conductivity type;
a first single crystal area of a first conductivity type provided on the second single crystal silicon germanium layer of the second conductivity type; and
a second single crystal area of the first conductivity type formed to extend into a part of the first single crystal silicon germanium layer of the second conductivity type, wherein:
an upper surface of said second single crystal silicon germanium layer of the second conductivity type is located above the lower surface of an edge of said polycrystal layer of the second conductivity type located on a side of said polycrystalline layer close to the second single crystal silicon germanium layer of the second conductivity type; and
an upper surface of the polycrystalline silicon germanium layer of the second conductivity type and an upper surface of the first single crystal layer are substantially at an equal level.

10. A bipolar transistor, comprising:
a silicon layer of a first conductivity type;
a multi-layer film comprising a first insulating film, a polycrystalline layer of a second conductivity type different from the first conductivity type, and a second insulating film deposited, respectively, onto the surface of said silicon layer of the first conductivity type;
an opening in the multi-layer film;
a first single crystal silicon germanium layer of the second conductivity type located in the opening;
a second single crystal silicon germanium layer of the second conductivity type provided on the first single crystal silicon germanium layer of the second conductivity type;
a polycrystalline silicon germanium layer of the second conductivity type provided so that it is in contact with the second single crystal silicon germanium layer of the second conductivity type and the polycrystalline layer of the second conductivity type;
a first single crystal area of the first conductivity type provided on the second single crystal silicon germanium layer of the second conductivity type; and
a second single crystal area of the first conductivity type, formed to extend into a part of the first single crystal silicon germanium layer of the second conductivity type and contacting the silicon layer of the first conductivity type,
wherein the level of an upper surface of said silicon layer of the first conductivity type and the level of an upper surface of said second single crystal area of the first conductivity type are different from each other.

11. A bipolar transistor according to claim 10,
wherein said first single crystal area of the first conductivity type is a single crystal silicon layer or a single crystal silicon germanium layer.

12. A bipolar transistor according to claim 10,
wherein said polycrystalline layer of the second conductivity type is a poly-silicon layer or a polycrystalline silicon germanium layer.

13. A bipolar transistor according to claim 10, further comprising:
a single crystal layer of the second conductivity type which is provided on said second single crystal silicon germanium layer of the second conductivity type in which the concentration of impurities is lower than in the second single crystal silicon germanium layer of the second conductivity type.

14. A bipolar transistor according to claim 13,
wherein said single crystal area of the second conductivity type is a single crystal silicon layer or a single crystal silicon germanium layer.

15. A bipolar transistor according to claim 10,
wherein said first insulating film is a silicon oxide film.

16. A bipolar transistor according to claim 10,
wherein said second insulating film is a silicon oxide film.

17. A bipolar transistor according to claim 10, further comprising:
a third insulating film having an opening between said first insulating film and said polycrystalline layer of the second conductivity type.

18. A bipolar transistor according to claim 17,
wherein said third insulating film is a silicon nitride film.

19. A bipolar transistor according to claim 10,
wherein an upper surface of said second single crystal silicon germanium layer of the second conductivity type is located above a lower surface of an edge of said polycrystalline layer of the second conductivity type of said polycrystalline layer on a side close to the second single crystal silicon germanium layer of the second conductivity type, and
wherein an upper surface of the polycrystalline silicon germanium layer of the second conductivity type and an upper surface of the first single crystal area of the first conductivity type are substantially at an equal level.

20. A bipolar transistor according to claim 10, wherein said second single crystal area of the first conductivity type extends completely through said first single crystal silicon germanium layer of the second conductivity type to contact a lower surface of the second single crystal silicon germanium layer of the second conductivity type.

21. A bipolar transistor according to claim 10, wherein the upper surface of the silicon layer of the first conductivity type is at a lower level than the upper surface of the second single crystal area of the first conductivity type.

* * * * *